United States Patent
Hirler et al.

(10) Patent No.: US 8,884,335 B2
(45) Date of Patent: Nov. 11, 2014

(54) SEMICONDUCTOR INCLUDING LATERAL HEMT

(71) Applicant: Infineon Technologies Austria AG, Villach (AT)

(72) Inventors: Franz Hirler, Isen (DE); Walter Rieger, Arnoldstein (AT); Markus Zundel, Egmating (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/681,958

(22) Filed: Nov. 20, 2012

(65) Prior Publication Data

US 2013/0075790 A1   Mar. 28, 2013

Related U.S. Application Data

(62) Division of application No. 12/764,669, filed on Apr. 21, 2010, now Pat. No. 8,314,447.

(30) Foreign Application Priority Data

Apr. 21, 2009  (DE) .......................... 10 2009 018 054

(51) Int. Cl.
| | |
|---|---|
| *H01L 29/739* | (2006.01) |
| *H01L 29/417* | (2006.01) |
| *H01L 29/10* | (2006.01) |
| *H01L 29/06* | (2006.01) |
| *H01L 29/778* | (2006.01) |
| *H01L 29/40* | (2006.01) |
| *H01L 29/66* | (2006.01) |

(52) U.S. Cl.
CPC ........ *H01L 29/778* (2013.01); *H01L 29/41766* (2013.01); *H01L 29/1075* (2013.01); *H01L 29/0619* (2013.01); *H01L 29/0653* (2013.01); *H01L 29/402* (2013.01); *H01L 29/7786* (2013.01); *H01L 29/0623* (2013.01); *H01L 29/66462* (2013.01)

USPC .................... 257/194; 257/192; 257/E29.246

(58) Field of Classification Search
CPC . H01L 29/205; H01L 19/267; H01L 29/4236; H01L 29/7788; H01L 29/7789
USPC .............. 257/12, 20, 183, 192, 194, E29.246
See application file for complete search history.

(56) References Cited

U.S. PATENT DOCUMENTS

| | | | |
|---|---|---|---|
| 6,100,549 | A | 8/2000 | Weitzel et al. |
| 6,476,431 | B1 | 11/2002 | Ohno et al. |

(Continued)

FOREIGN PATENT DOCUMENTS

| | | |
|---|---|---|
| JP | 56-080183 | 1/1981 |
| JP | 10-270570 | 10/1998 |

(Continued)

OTHER PUBLICATIONS

Non-Final Office Action mailed Mar. 29, 2012 in U.S. Appl. No. 12/764,669.

(Continued)

*Primary Examiner* — Matthew E Warren
(74) *Attorney, Agent, or Firm* — Dicke, Billig & Czaja, PLLC

(57) ABSTRACT

A semiconductor including a lateral HEMT and to a method for production of a lateral HEMT is disclosed. In one embodiment, the lateral HEMT has a substrate and a first layer, wherein the first layer has a semiconductor material of a first conduction type and is arranged at least partially on the substrate. Furthermore, the lateral HEMT has a second layer, wherein the second layer has a semiconductor material and is arranged at least partially on the first layer. In addition, the lateral HEMT has a third layer, wherein the third layer has a semiconductor material of a second conduction type, which is complementary to the first conduction type, and is arranged at least partially in the first layer.

13 Claims, 12 Drawing Sheets

(56) References Cited

U.S. PATENT DOCUMENTS

| | | | |
|---|---|---|---|
| 6,489,628 | B1 | 12/2002 | Morizuka |
| 6,940,090 | B2 | 9/2005 | Saito et al. |
| 7,227,226 | B2 * | 6/2007 | Kawamura .................. 257/332 |
| 7,250,641 | B2 | 7/2007 | Saito et al. |
| 7,417,267 | B2 | 8/2008 | Beach |
| 2004/0157355 | A1 | 8/2004 | Kachi et al. |
| 2006/0071250 | A1 | 4/2006 | Bude et al. |
| 2007/0007547 | A1 | 1/2007 | Beach |
| 2007/0026587 | A1 | 2/2007 | Briere |
| 2007/0066020 | A1 | 3/2007 | Beach |
| 2008/0054303 | A1 | 3/2008 | Beach |
| 2008/0237632 | A1 * | 10/2008 | Kinzer .......................... 257/162 |
| 2008/0315257 | A1 | 12/2008 | Shiraishi |

FOREIGN PATENT DOCUMENTS

| | | |
|---|---|---|
| JP | 2004-260140 | 9/2004 |
| JP | 2006/507683 | 3/2006 |
| JP | 2006-351691 | 12/2006 |
| JP | 2007-189474 | 7/2007 |
| JP | 2007-537594 | 12/2007 |
| JP | 2008-177515 | 7/2008 |
| JP | 2008-258419 | 10/2008 |
| JP | 2009-004397 | 1/2009 |
| JP | 2009-009993 | 1/2009 |
| JP | 2009-164158 | 7/2009 |
| WO | 2004/049454 | 6/2004 |
| WO | 2005/114743 | 12/2005 |

OTHER PUBLICATIONS

"Quad/Dual EPAD Precision Matched Pair N-Channel Mosfet Array", Advanced Linear Devices Inc., 2003 (8 pgs.).

"RESURF AlGaN/GaN HEMT for High Voltage Power Switching", Shreepad Karmalkar, et al., IEEE 2001 (3 pgs.).

* cited by examiner

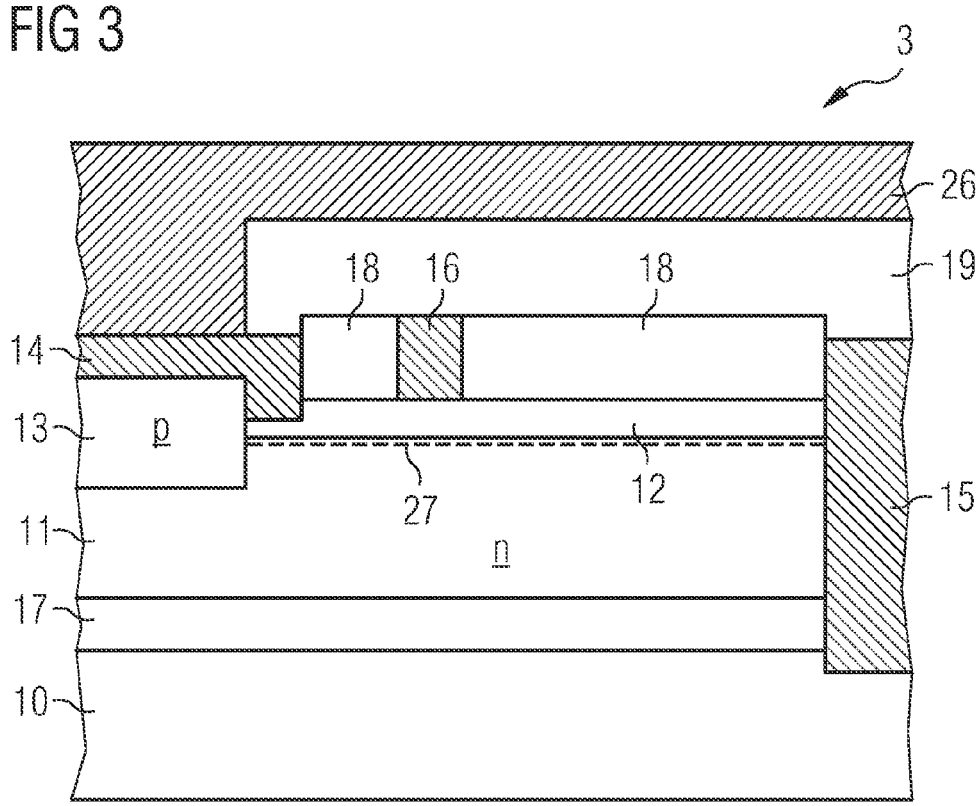

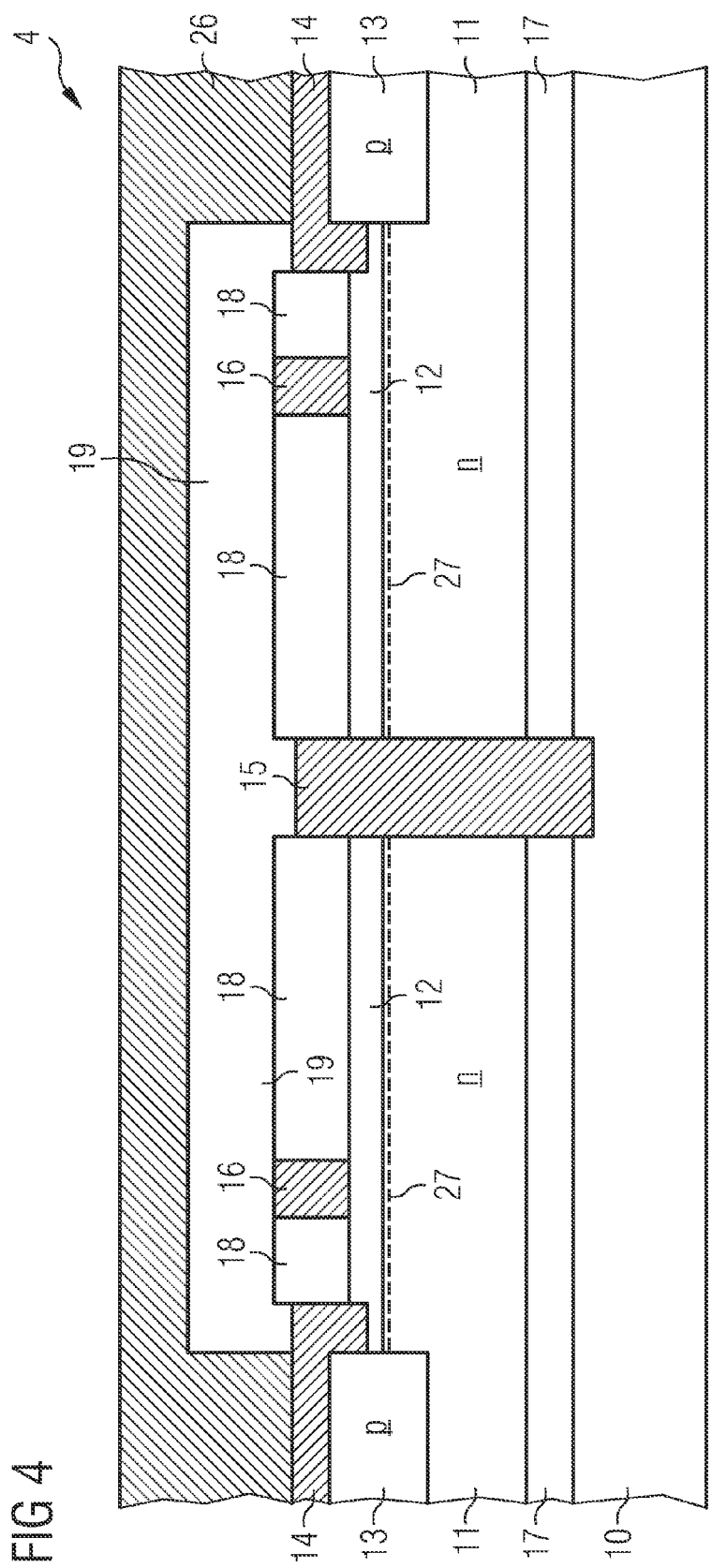

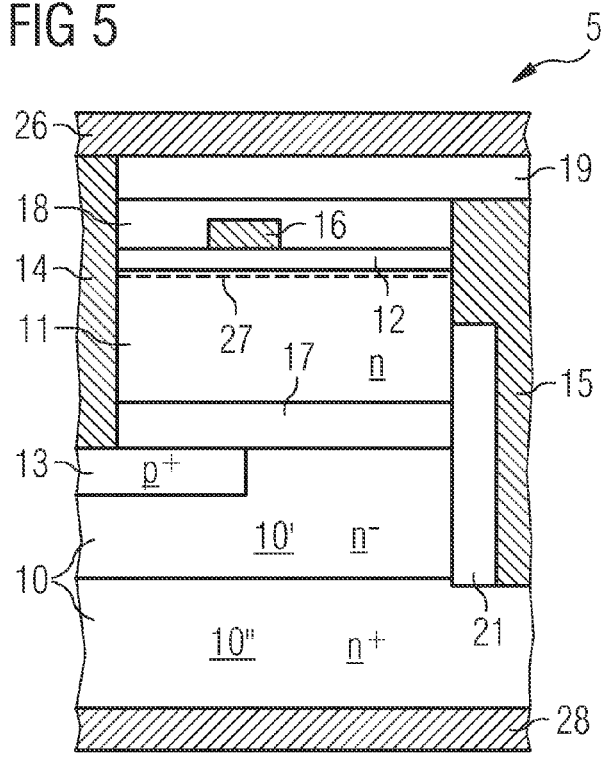
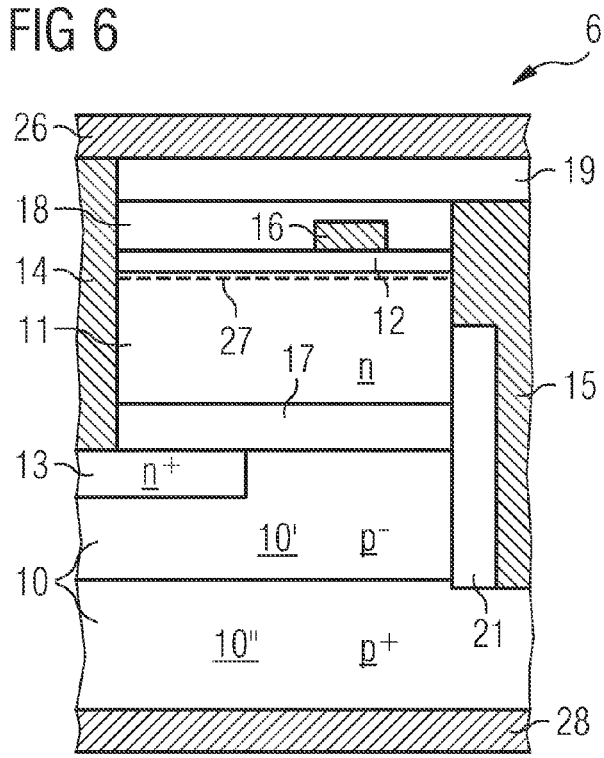

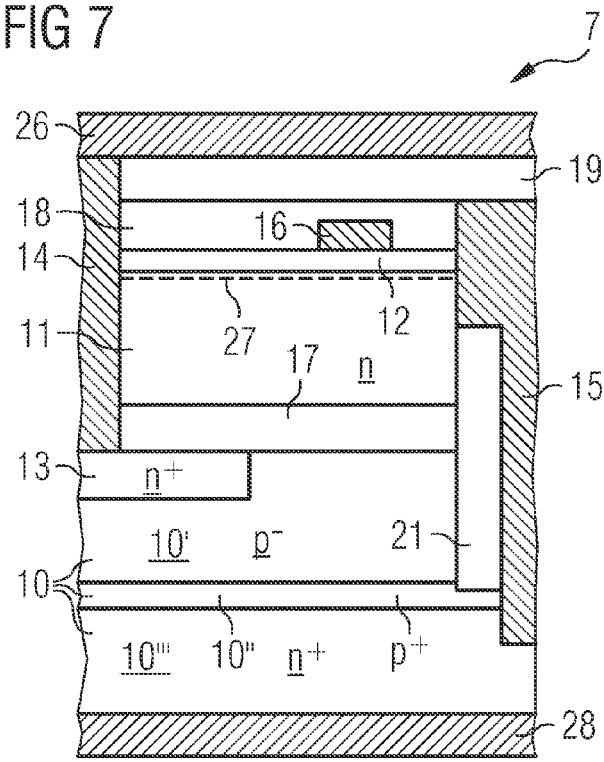
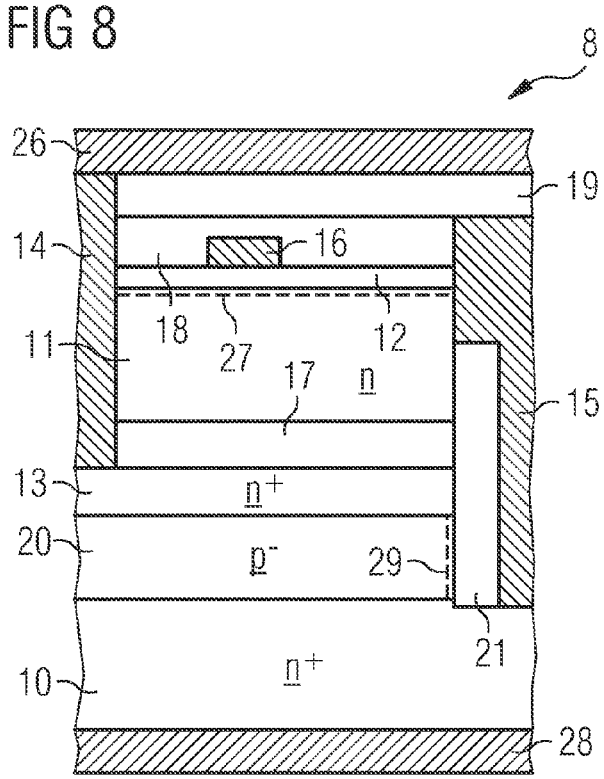

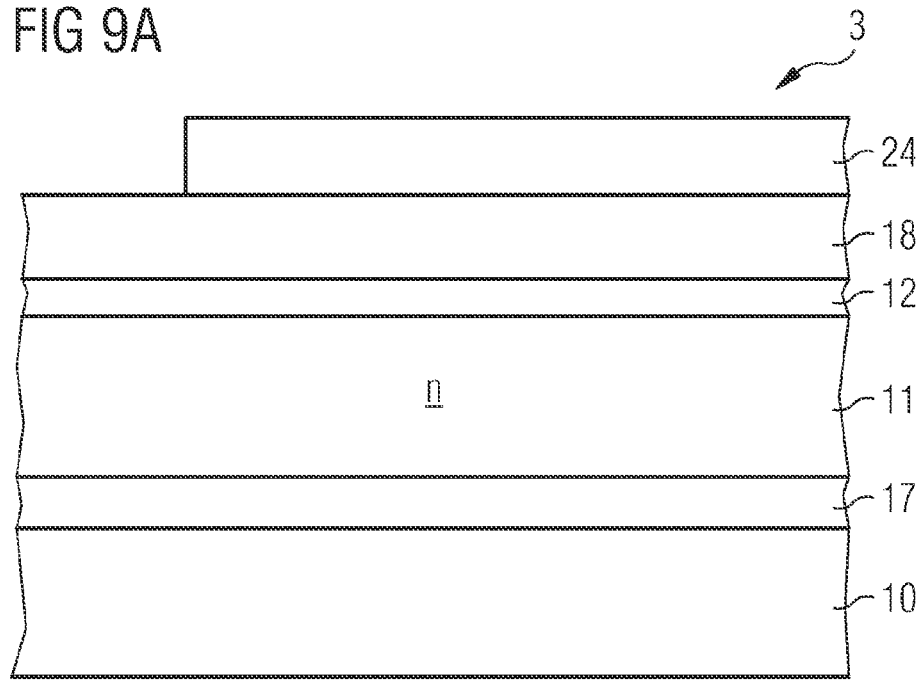
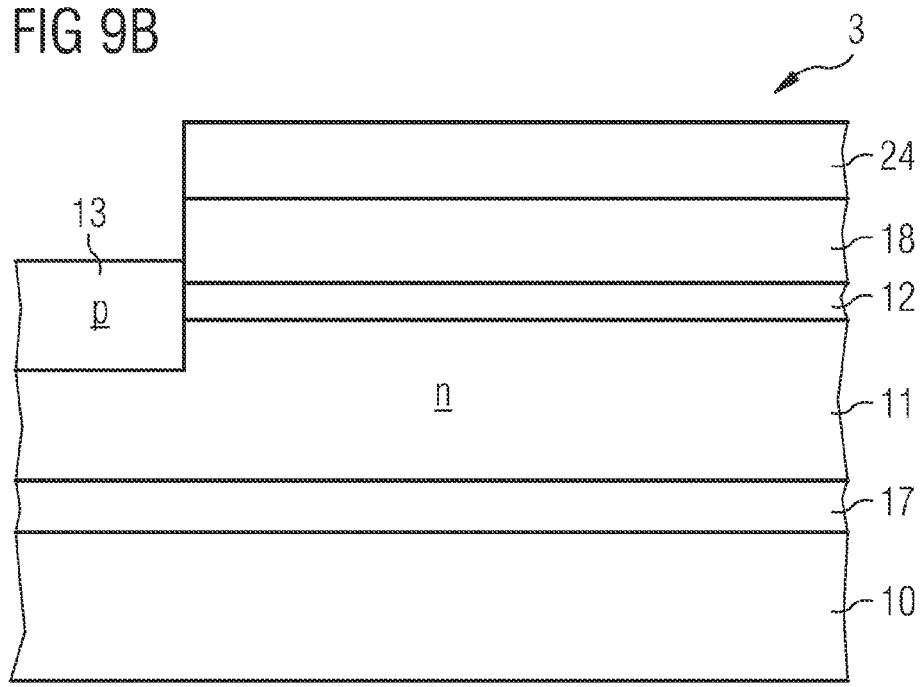

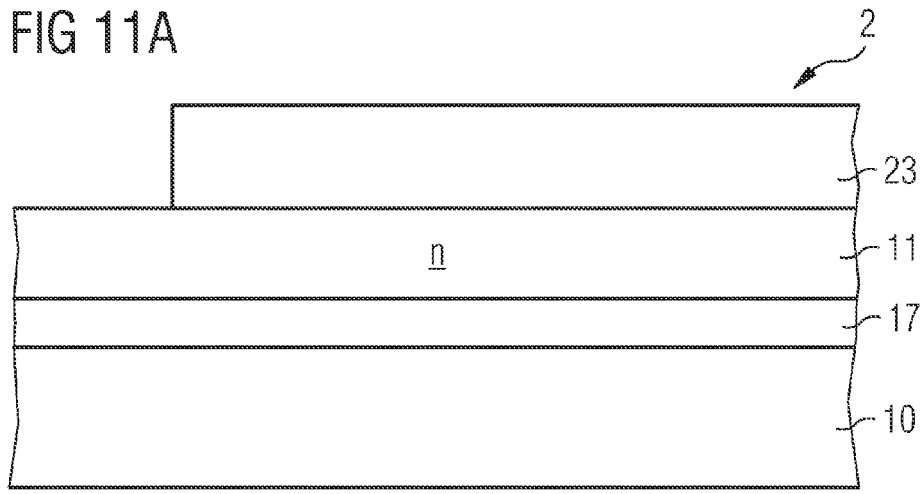
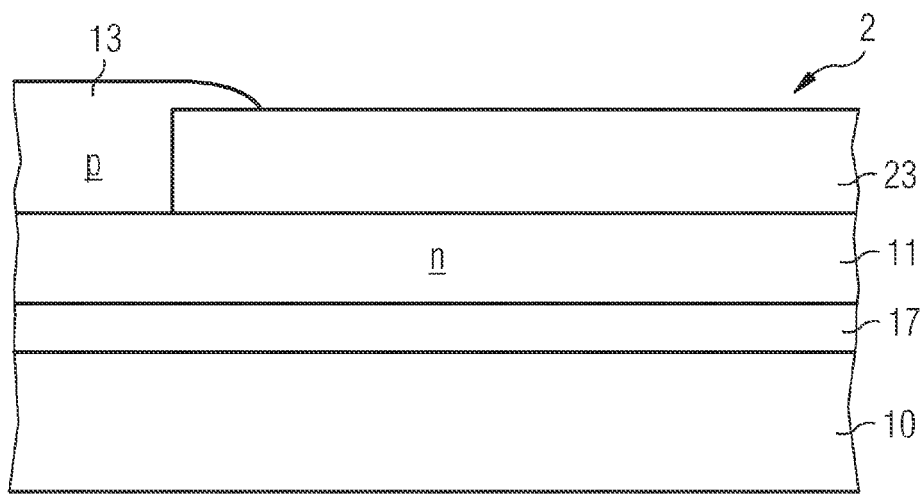
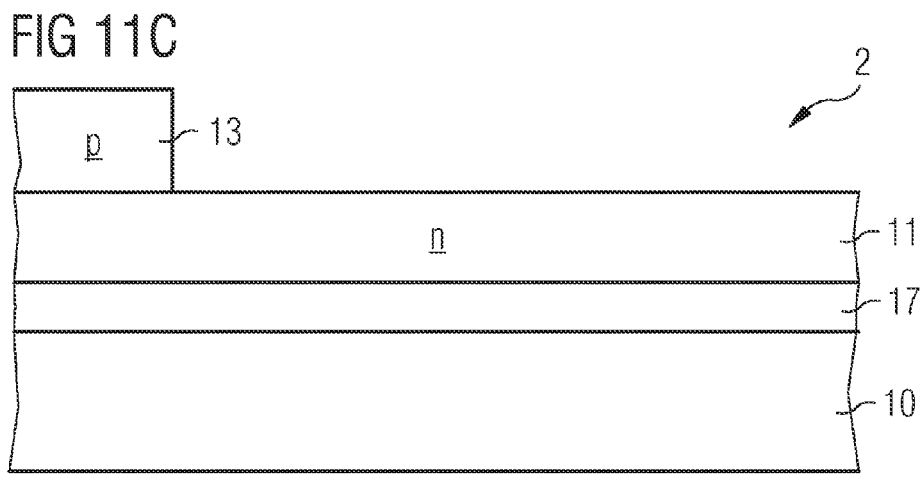

SEMICONDUCTOR INCLUDING LATERAL HEMT

CROSS REFERENCE TO RELATED APPLICATIONS

This Utility patent application is a divisional of U.S. application Ser. No. 12/764,669, filed Apr. 21, 2010, which claims priority to German Patent Application No. DE 10 2009 018 054.0, filed on Apr. 21, 2009, which both are incorporated herein by reference.

BACKGROUND

The invention relates to a semiconductor including a lateral HEMT and to a method for production of a semiconductor including a lateral HEMT.

The majority of previous power semiconductor components have been produced based on silicon. Associated with this, the power density which can be achieved and the operating temperature of the semiconductor components are limited. Applications at high frequencies are also reaching their limits. The main reason for this is the limited breakdown field strength of silicon, since, in the end, this governs the thickness of the depletion layer and its maximum doping.

The requirement for ever higher performance with ever lower production costs for power semiconductor components has in the meantime necessitated the miniaturization of the components to such an extent that the power density has reached the physical limits of silicon.

Alternative material systems are often compound semiconductors which have a greater band gap, a higher breakdown field strength and often also better thermal conductivity in comparison to silicon. The best known material for this purpose in the field of power semiconductor components is SiC which, despite known restrictions relating to the wafer size and the material quality as well as the channel mobility, are used in particular for diodes and bipolar transistors in high blocking capability components. Until now, field-controlled components have existed only in the form of JFETs which, however, have the disadvantage that they are depletion-type components. Particularly in high-power application areas, in contrast, enhancement-type components are actually preferred since fault situations can be coped with considerably more easily with them during use. Semiconductors with a large band gap, in particular III-V nitrides, are further material systems which are highly suitable for optical and further electronic semiconductor components, because of their characteristics. In addition to optoelectronics, these material systems are also increasingly being used in radio-frequency technology.

The use of these material systems is also advantageous for the power electronics field since, in comparison to silicon, they allow components with the same blocking capability, with higher doping and a shorter drift zone at the same time. However, the processing of components composed of these material systems is subject to restrictions in comparison to silicon technology, since certain methods which are used in silicon technology are not available, or are available only to a restricted extent, for III-V semiconductor systems.

Power semiconductor components based on III-V compound semiconductors have until now been produced in the form of lateral components. These are so-called HEMTs (high electron mobility transistors), for which one important aspect is the provision of a self-blocking component. In this case, an HEMT has a plurality of layers composed of differently doped semiconductor materials with band gaps of different magnitude. Because the band gaps of the individual layers have different magnitudes, a two-dimensional electron gas (2DEG) is formed at their interface, and acts as a conductive channel. In this case, the electron mobility and the 2D electron charge carrier density in the two-dimensional electron gas are very high.

U.S. Pat. No. 7,250,641 B2 discloses an HFET (heterostructure field effect transistor) based on the material system AlGaN/GaN, in which a two-dimensional electron gas is formed in the interface layer between the two materials. In this case, a layer composed of AlGaN is arranged on a layer composed of GaN. Furthermore, in one embodiment, a p-conductive layer composed of GaN is arranged between the layer composed of GaN and a silicon substrate. This results in a pin diode being formed between the substrate and a drain electrode, as a result of which holes which are generated when an avalanche breakdown occurs are discharged into the substrate via the p-conductive GaN layer.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

The embodiments will now be explained in more detail with reference to the attached figures.

FIG. 3 illustrates a lateral HEMT according to a third embodiment.

FIG. 4 illustrates a lateral HEMT according to a fourth embodiment.

FIG. 5 illustrates a lateral HEMT according to a fifth embodiment.

FIG. 6 illustrates a lateral HEMT according to a sixth embodiment.

FIG. 7 illustrates a lateral HEMT according to a seventh embodiment.

FIG. 8 illustrates a lateral HEMT according to an eighth embodiment.

FIGS. 9A to 9D illustrate a first embodiment of a method for production of a power semiconductor including a lateral HEMT.

FIGS. 11A to 11E illustrate a third embodiment of a method for production of a lateral HEMT.

DETAILED DESCRIPTION

Figure 1:
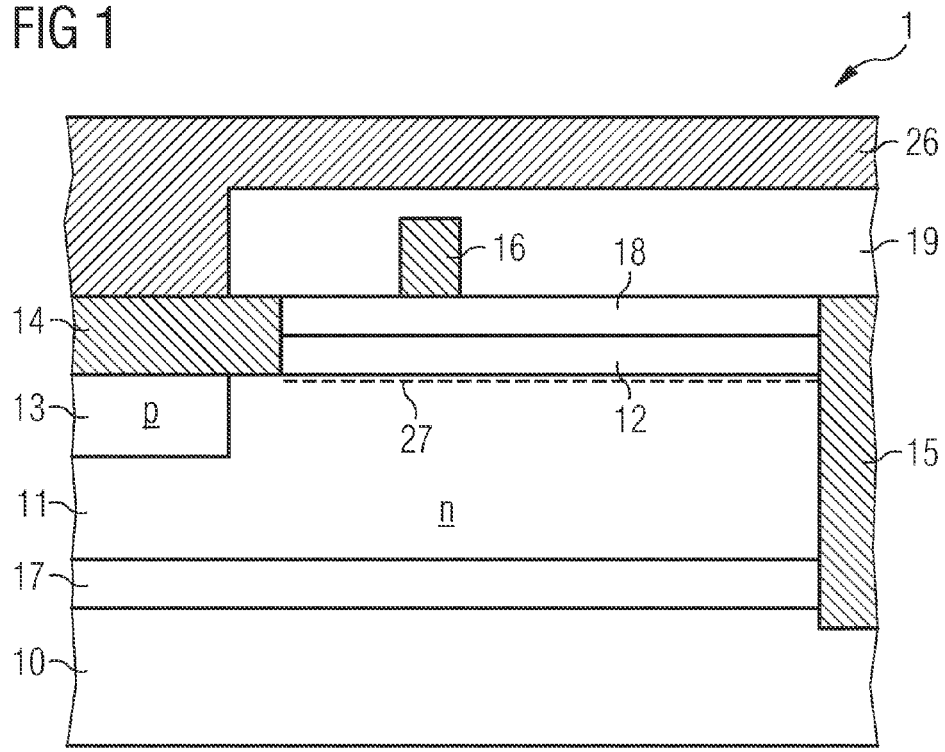
FIG. 1 illustrates a power semiconductor including a lateral HEMT according to a first embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back,"

"leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides a power semiconductor including a lateral HEMT as well as a method for production of a power semiconductor including a lateral HEMT which has a high avalanche breakdown strength.

According to one embodiment, a lateral HEMT is provided which has a substrate and a first layer, wherein the first layer has a semiconductor material of a first conduction type and is arranged at least partially on the substrate. Furthermore, the HEMT has a second layer, wherein the second layer has a semiconductor material and is arranged at least partially on the first layer. Furthermore, the HEMT has a third layer, wherein the third layer has a semiconductor material of a second conduction type, which is complementary to the first conduction type, and is arranged at least partially in the first layer.

A pn diode is therefore formed between the first layer and the third layer in the lateral HEMT according to one embodiment. The highest electrical field strength is located under the third layer, as a result of which the field strength and therefore also the voltage within the HEMT are limited. The pn diode has a lower breakdown voltage than the lateral HEMT, as a result of which, in the event of an avalanche breakdown, the breakdown takes place under the third layer, and the hot charge carriers which are generated therefore do not come into the vicinity of the two-dimensional electron gas. The HEMT is therefore protected when an avalanche breakdown occurs, thus preventing degradation of the semiconductor component.

In one embodiment of the HEMT, the third layer is arranged completely in the first layer.

In another embodiment, the third layer is also arranged partially in the second layer.

Furthermore, the lateral HEMT may have a first electrode, a second electrode and a gate electrode. The first electrode may in this case extend vertically from the second layer to the third layer, and the second electrode may extend vertically from the second layer partially into the substrate. This allows contact to be made between the third layer and the first electrode.

In one embodiment, the first layer has GaN. Furthermore, the second layer may have AlGaN and the third layer GaN. The substrate may have Si, SiC or $Al_2O_3$ (sapphire).

In one embodiment, the second layer is undoped.

Furthermore, the lateral HEMT may have a buffer layer, wherein the buffer layer is arranged between the substrate and the first layer. In one refinement, the buffer layer has AlN, GaN or AlGaN. AlN is electrically insulating, while in contrast, GaN is electrically conductive and AlGaN is weakly electrically conductive if the Al content is low, that is to say less than 10%. A suitable buffer layer can therefore be provided, depending on the requirement for the lateral HEMT.

In a further embodiment, the lateral HEMT has a passivation layer, wherein the passivation layer is arranged at least partially on the second layer. By way of example, the passivation layer may have $Si_xN_y$, $SiO_2$ or $Al_2O_3$.

Furthermore, the lateral HEMT may have an insulation layer, wherein the insulation layer is arranged at least partially on the passivation layer.

In a further embodiment, a lateral HEMT has a substrate and a first layer, wherein the first layer has a semiconductor material of a first conduction type and is arranged at least partially on the substrate. Furthermore, the lateral HEMT has a second layer, wherein the second layer has a semiconductor material and is arranged at least partially on the first layer. In addition, the lateral HEMT has a third layer, wherein the third layer has a semiconductor material and is arranged at least partially in the substrate.

This embodiment of the lateral HEMT likewise has voltage limiting and high avalanche breakdown strength as a result of the formation of a pn diode, as has already been explained in more detail above and will not be stated once again at this point, in order to avoid repetitions. In contrast to the above-mentioned embodiments, the voltage limiting in the lateral HEMT is in this case carried out in the substrate, by the pn diode being formed between the substrate and the third layer.

In one embodiment, the semiconductor material of the third layer has a second conduction type, which is complementary to the first conduction type, and the substrate has a semiconductor material of the first conduction type.

In one alternative embodiment, the semiconductor material of the third layer has the first conduction type, and the substrate has a semiconductor material of a second conduction type, which is complementary to the first conduction type.

Furthermore, the lateral HEMT may have a first electrode, a second electrode and a gate electrode. In this case, the first electrode may extend vertically from the second layer to the third layer, and the second electrode may extend vertically from the second layer partially into the substrate. This allows contact to be made between the third layer and the first electrode.

In one embodiment, the first layer has GaN. Furthermore, the second layer may have AlGaN and the third layer Si. The substrate may have Si or SiC.

In one embodiment, the second layer is undoped.

Furthermore, the lateral HEMT may have a buffer layer, wherein the buffer layer is arranged between the substrate and the first layer. In one refinement, the buffer layer has AlN, GaN or AlGaN. AlN is electrically insulating, while in contrast, GaN is electrically conductive and AlGaN is weakly electrically conductive if the Al content is low, that is to say less than 10%. A suitable buffer layer can therefore be provided, depending on the requirement for the lateral HEMT.

In a further embodiment, the lateral HEMT has a passivation layer, wherein the passivation layer is arranged at least partially on the second layer. By way of example, the passivation layer may have $Si_xN_y$, $SiO_2$ or $Al_2O_3$.

Furthermore, the lateral HEMT may have an insulation layer, wherein the insulation layer is arranged at least partially on the passivation layer.

In a further embodiment, a lateral HEMT has a substrate, wherein the substrate has a semiconductor material of a first conduction type. Furthermore, the lateral HEMT has a first layer and a second layer, wherein the first layer has a semiconductor material of the first conduction type and is arranged at least partially on the substrate, and wherein the second layer has a semiconductor material and is arranged at least partially on the first layer. In addition, the lateral HEMT has a third layer and a fourth layer, wherein the third layer has a semiconductor material of the first conduction type and is arranged at least partially under the first layer, and wherein the fourth layer has a semiconductor material of a second conduction type, which is complementary to the first conduction type, and is arranged at least partially under the third layer. Furthermore, the lateral HEMT has a first electrode, a second electrode and a gate electrode, wherein the first electrode extends vertically from the second layer to the third layer, and wherein the second electrode extends vertically from the second layer partially into the substrate. Furthermore, a first insulation layer is arranged between the second electrode and the third layer, and between the second electrode and the fourth layer.

This embodiment differs from the previous embodiments in that a field-effect transistor is used rather than a diode for voltage limiting. If the voltage at the second electrode rises above the threshold voltage of this field-effect transistor, then a conductive channel is induced within the fourth layer, close to the first insulation layer. The threshold voltage in this case depends on the thickness of the first insulation layer, the material of the first insulation layer, and the doping of the fourth layer. A current flows, which may limit the voltage which occurs in the lateral HEMT. This in turn allows a semiconductor component to have a high avalanche breakdown strength.

In one embodiment, the first layer has GaN. Furthermore, the second layer may have AlGaN, and the third layer as well as the fourth layer may have Si. The substrate may have Si or SiC.

In one embodiment, the second layer is undoped.

Furthermore, the lateral HEMT may have a buffer layer, wherein the buffer layer is arranged between the substrate and the first layer. In one embodiment, the buffer layer has AlN, GaN or AlGaN. AlN is electrically insulating, while in contrast, GaN is electrically conductive and AlGaN is weakly electrically conductive if the Al content is low, that is to say less than 10%. A suitable buffer layer can therefore be provided, depending on the requirement for the lateral HEMT.

In a further embodiment, the lateral HEMT has a passivation layer, wherein the passivation layer is arranged at least partially on the second layer. By way of example, the passivation layer may have $Si_xN_y$, $SiO_2$ or $Al_2O_3$.

Furthermore, the lateral HEMT may have a further insulation layer, wherein the further insulation layer is arranged at least partially on the passivation layer.

In addition to a diode and a field-effect transistor, a bipolar transistor, an IGBT, a varistor and ESD protective structures may also be used as a voltage-limiting element, wherein the respective voltage-limiting element is in this case integrated in the lateral HEMT in a corresponding manner to the diode and the field-effect transistor, respectively.

The lateral HEMT in all of the abovementioned embodiments may be in the form of a MOSFET, MESFET (metal semiconductor field effect transistor), HFET (heterostructure field effect transistor) and PI-HEMT (polarization induced high electron mobility transistor).

One method for production of a power semiconductor having a lateral HEMT has the following process. A substrate, a first layer, a second layer and a passivation layer are provided, wherein the first layer has a semiconductor material of a first conduction type and is arranged at least partially on the substrate, and wherein the second layer has a semiconductor material and is arranged at least partially on the first layer. Furthermore, the passivation layer is arranged at least partially on the second layer. The first layer, the second layer and the passivation layer are partially removed. Furthermore, a third layer is grown on the first layer, wherein the third layer has a semiconductor material of a second conduction type, which is complementary to the first conduction type. A first electrode, a second electrode and a gate electrode are produced, wherein the first electrode extends vertically from the second layer to the third layer, and the second electrode extends vertically from the second layer partially into the substrate.

The partial removal of the first layer, of the second layer and of the passivation layer can be carried out by using an etching process using a structured mask.

A further method according to the invention for production of a lateral HEMT has the following process. A substrate and a first layer are provided, wherein the first layer has a semiconductor material of a first conduction type and is arranged at least partially on the substrate. A third layer is grown on the first layer, wherein the third layer has a semiconductor material of a second conduction type, which is complementary to the first conduction type. The first layer and the third layer are partially removed. Furthermore, a fourth layer and a second layer are grown on the first layer, wherein the fourth layer has a semiconductor material of the first conduction type, and wherein the second layer has a semiconductor material. A passivation layer is applied at least partially on the fourth layer, and a first electrode, a second electrode and a gate electrode are produced, wherein the first electrode extends vertically from the second layer to the third layer, and the second electrode extends vertically from the second layer partially into the substrate.

The partial removal of the first layer and of the third layer can be carried out by using an etching process using a structured mask.

A further method for production of a lateral HEMT has the following steps. A substrate and a first layer are provided, wherein the first layer has a semiconductor material of a first conduction type and is arranged at least partially on the substrate. A structured mask is applied on the first layer. A third layer is grown on the first layer, wherein the third layer has a semiconductor material of a second conduction type, which is complementary to the first conduction type. The first layer and the third layer are partially removed. The third layer is partially removed and furthermore the mask is removed. A fourth layer and a second layer are grown on the first layer, wherein the fourth layer has a semiconductor material of the first conduction type, and wherein the second layer has a semiconductor material. A passivation layer is applied at least partially on the fourth layer, and a first electrode, a second electrode and a gate electrode are produced, wherein the first electrode extends vertically from the second layer to the third layer and the second electrode extends vertically from the second layer partially into the substrate.

The partial removal of the third layer can be carried out by using a CMP process (chemical mechanical polishing).

In one embodiment of the method, a buffer layer is applied between the substrate and the first layer.

In a further embodiment of the method, an insulation layer is applied at least partially on the passivation layer.

In a further embodiment of the method, the second layer is undoped.

FIG. 1 illustrates a power semiconductor including a lateral HEMT 1 according to a first embodiment. The lateral HEMT 1 has a substrate 10 and a buffer layer 17 which is arranged on the substrate 10. In this case, the substrate 10 may have Si, SiC or $Al_2O_3$. The buffer layer 17 may have AlN, GaN or AlGaN. AlN is electrically insulating, while in contrast GaN is electrically conductive and AlGaN is weakly electrically conductive if the content of Al is low, being less than 10%. A suitable buffer layer can therefore be provided, depending on the requirement for the lateral HEMT.

A first layer 11 is arranged on the buffer layer 17. The second layer 12 is arranged on the first layer 11. In the illustrated embodiment, the first layer 11 has n-conductive GaN, and the second layer 12 has AlGaN. The AlGaN is in this case compensated, that is to say it does not have free charge carriers and is therefore electrically non-conductive. A two-dimensional electron gas is formed on the interface surface between the first layer 11 and the second layer 12, and is illustrated schematically in FIG. 1 by a dashed line 27.

The HEMT 1 furthermore has a third layer 13, which is arranged partially in the first layer 11. In the illustrated embodiment, the third layer 13 has p-conductive GaN. A first electrode 14 is arranged on the first layer 11 and on the third layer 13 and makes contact with the first layer 11, the second layer 12 and the third layer 13. A second electrode 15 extends vertically from the second layer 12 partially into the substrate 10. Furthermore, a passivation layer 18 is arranged on the second layer 12. A gate electrode 16 is arranged on the passivation layer 18 and is partially surrounded by an insulation layer 19. The insulation layer 19 may in this case be an ILD (inter-layer dielectric). The lateral HEMT 1 can be controlled by using the gate electrode 16. In the illustrated embodiment, the first electrode 14 is a source electrode, and the second electrode 15 is a drain electrode. A layer 26 composed of electrically conductive material, for example of a metal, a silicide or highly-doped polysilicon, is arranged on the insulation layer 19 and makes contact with the first electrode 14. FIG. 1 does not illustrate a contact, which is likewise made, with the second electrode 15. In the situation in which the substrate 10 has an electrically conductive material, the contact with the second electrode 15 may in this case be arranged on the rear face of the substrate 10 (not illustrated).

Together with the first layer 11, the third layer 13 forms a pn diode, which increases the avalanche breakdown strength of the lateral HEMT 1. For this purpose, the pn diode has a lower breakdown voltage than the breakdown voltage of the lateral HEMT 1. The breakdown therefore takes place under the third layer 13, as a result of which the hot charge carriers which are generated do not come into the vicinity of the two-dimensional electron gas.

Figure 2:
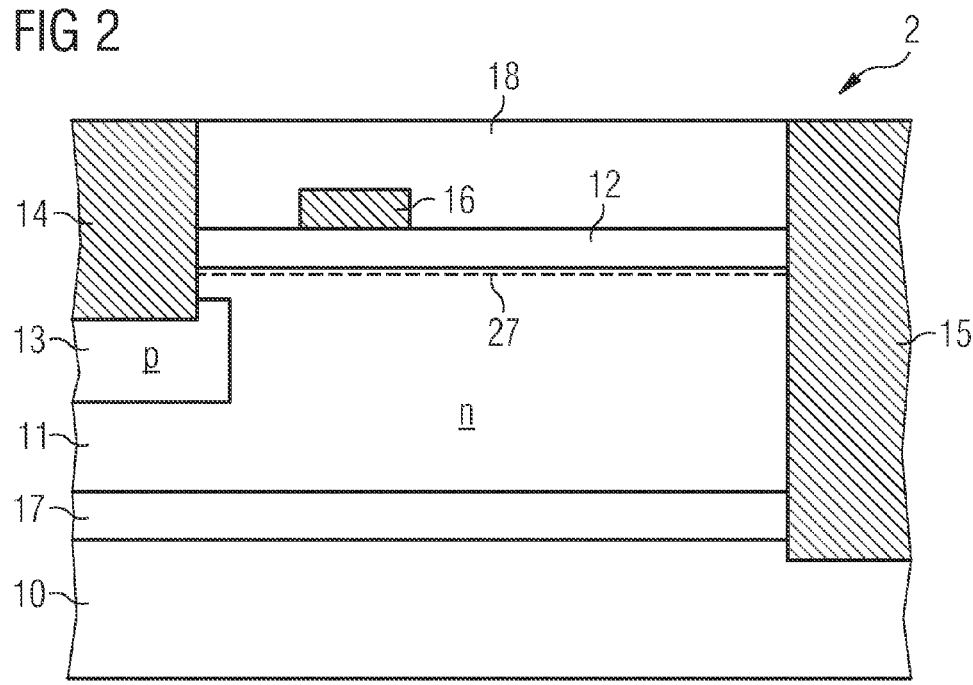
FIG. 2 illustrates a lateral HEMT according to a second embodiment.

FIG. 2 illustrates a lateral HEMT 2 according to a second embodiment. Components having the same functions as in FIG. 1 are identified by the same reference numbers, and will not be explained in more detail in the following.

The lateral HEMT 2 differs from the lateral HEMT 1 illustrated in FIG. 1 in that the third layer 13 is arranged completely within the first layer 11. Furthermore, the gate electrode 16 is arranged directly on the second layer 12, and is surrounded in the remaining areas by the passivation layer 18. The insulation layer 19, the layer 26 and the contact which is likewise made with the second electrode 15 are not illustrated in FIG. 2.

FIG. 3 illustrates a lateral HEMT 3 according to a third embodiment. Components having the same functions as in the previous figures are identified by the same reference numbers, and will not be explained in more detail in the following.

The lateral HEMT 3 differs from the two previously illustrated HEMTs in that the third layer 13 is also arranged partially in the second layer 12. The gate electrode 16 is arranged directly on the second layer 12, as in the case of the lateral HEMT 2 as well, and is surrounded by the passivation layer 18 in the remaining areas. FIG. 3 does not illustrate a contact that is likewise made with the second electrode 15.

FIG. 4 illustrates a lateral HEMT 4 according to a fourth embodiment. Components having the same functions as in the previous figures are identified by the same reference numbers, and will not be explained in more detail in the following.

In this case, the lateral HEMT 4 is similar to the lateral HEMT 3 illustrated in FIG. 3. The lateral HEMT 4 has an alternating arrangement of first electrodes 14 and second electrodes 15. In this case, a first electrode 14 is followed in a lateral direction by a second electrode 15 and, adjacent to it, once again by a first electrode 14. Contact which is likewise made with the second electrode 15 is not illustrated in FIG. 4.

The lateral HEMTs 2 to 4 shown in FIGS. 2 to 4 likewise have a pn diode, which is formed by the first layer 11 and the third layer 13. These semiconductor components therefore likewise have a high avalanche breakdown strength, as has already been explained in conjunction with the lateral HEMT 1 illustrated in FIG. 1.

FIG. 5 illustrates a lateral HEMT 5 according to a fifth embodiment.

The lateral HEMT 5 has a substrate 10, wherein the substrate 10 has a first layer 10" and a second layer 10' arranged on it. In the illustrated embodiment, the first layer 10" has $n^+$-doped silicon, and the second layer 10' has $n^-$-doped silicon. A buffer layer 17 which, for example, may have AlN is arranged on the second layer 10'. A first layer 11, which in the illustrated embodiment has n-conductive GaN, is arranged on the buffer layer 17. A second layer 12 is arranged on the first layer 11. In the illustrated embodiment, the second layer 12 has AlGaN. The AlGaN is in this case compensated, that is to say it does not have free charge carriers, and is therefore electrically non-conductive. A two-dimensional electron gas is formed between the first layer 11 and the second layer 12, and is illustrated schematically in FIG. 5 by a dashed line 27.

Furthermore, the lateral HEMT 5 has a third layer 13 which is arranged partially in the substrate 10. In the illustrated embodiment, the third layer 13 has $p^+$-doped silicon. Furthermore, the lateral HEMT 5 has a first electrode 14, a second electrode 15 and a gate electrode 16. The first electrode 14 extends vertically from the second layer 12 to the third layer 13, and the second electrode 15 extends vertically from the second layer 12 partially into the substrate 10. In the illustrated embodiment, the first electrode 14 is a source electrode, and the second electrode 15 is a drain electrode. The gate electrode 16 is arranged directly on the second layer 12, and the remaining part is surrounded by a passivation layer 18. The gate electrode 16 is in this case used to control the lateral HEMT 5. A layer 26 which is composed of an electrically conductive material, for example a metal, a silicide or a heavily doped polysilicon, makes contact with the first electrode 14. In this case, an insulation layer 19 is arranged between the layer 26 and the passivation layer 18. An insulation layer 21 which is composed, for example, of $Si_xN_y$ or of an oxide is arranged between the second electrode 15 and the first layer 11, the buffer layer 17 and the second layer 10' of the substrate 10.

The third layer 13 and the second layer 10' of the substrate 10 form a pn diode. This allows voltage limiting for the lateral HEMT 5 analogously to the embodiments shown in FIGS. 1 to 4 and, associated with this, a high avalanche breakdown strength.

A layer 28 composed of an electrically conductive material is arranged under the first layer 10" of the substrate 10 and is connected to the second electrode 15. The layer 28 is in this case used to make contact with the second electrode 15. FIG. 5 does not illustrate the connection between the layer 28 and the second electrode 15.

FIG. 6 illustrates a lateral HEMT 6 according to a sixth embodiment. Components having the same functions as in FIG. 5 are identified by the same reference numbers, and will not be explained in more detail in the following.

The lateral HEMT 6 differs from the lateral HEMT 5 in that the first electrode 14 is a drain electrode and the second electrode 15 is a source electrode. The third layer 13 as well as the first layer 10" and the second layer 10' of the substrate 10 are each of the complementary conduction type to the layers in the lateral HEMT 5.

In one embodiment, which is not illustrated, the second layer 10' of the substrate 10 is in the form of an $n^-$-conductive layer.

FIG. 7 illustrates a lateral HEMT 7 according to a seventh embodiment.

The lateral HEMT 7 differs from the lateral HEMT 6 illustrated in FIG. 6 in that a third layer 10''', which has $n^+$-doped silicon in the illustrated embodiment, is arranged between the first layer 10" of the substrate 10 and the layer 28. In this case, the second electrode 15 extends into the third layer 10''', and therefore electrically shorts the first layer 10" and the third layer 10'''.

FIG. 8 illustrates a lateral HEMT 8 according to an eighth embodiment.

The lateral HEMT 8 has a substrate 10 which, in the illustrated embodiment, has $n^+$-doped silicon. A fourth layer 20, which has $p^-$-doped silicon, is arranged on the substrate 10. A third layer 13, which has $n^+$-doped silicon, is arranged on the fourth layer 20. Furthermore, the lateral HEMT 8 has a buffer layer 17 which is arranged on the third layer 13. By way of example, the buffer layer 17 may have AlN. A first layer 11 is arranged on the buffer layer 17 and, in the illustrated embodiment, has n-conductive GaN. A second layer 12, which has AlGaN, is arranged on the first layer 11. The AlGaN is in this case compensated, that is to say it does not have any free charge carriers, and is therefore electrically non-conductive. A two-dimensional electron gas is formed between the first layer 11 and the second layer 12, as is indicated schematically in FIG. 8 by a dashed line 27.

Furthermore, the lateral HEMT 8 has a first electrode 14, a second electrode 15 and a gate electrode 16. The gate electrode 16 is arranged directly on the second layer 12 and is used to control the lateral HEMT 8. The first electrode 14 extends vertically from the second layer 12 to the third layer 13, and the second electrode 15 extends vertically from the second layer 12 partially into the substrate 10. A first insulation layer 21 is arranged between the second electrode 15 and the first layer 11, the buffer layer 17, the third layer 13 and the fourth layer 20. The insulation layer 21 has in this case, for example, an oxide or $Si_xN_y$. In the illustrated embodiment, the first electrode 14 is a source electrode, and the second electrode 15 is a drain electrode. A layer 26 composed of electrically conductive material, for example a metal, a silicide or heavily doped polysilicon, makes contact with the first electrode 14, and a layer 28 composed of electrically conductive material is electrically connected to the second electrode 15 (not shown). An insulation layer 19 is arranged between the layer 26 and the passivation layer 18.

The lateral HEMT 8 differs from the embodiments shown in FIGS. 1 to 7 in that no diode is used to limit the voltage on the lateral HEMT 8, but this is done by using an n-channel field-effect transistor, which is formed by the third layer 13, the fourth layer 20, the substrate 10 and the second electrode 15. Thus, in this case, if the voltage applied to the second electrode 15 rises above the threshold voltage of the n-channel field-effect transistor, then a conductive channel is induced, as is indicated schematically by a dashed line 29 in FIG. 8. A current flows through here, which can limit the voltage dropped across the component and therefore results in the component having a high avalanche breakdown strength. This embodiment allows the component to be miniaturized in the lateral direction.

FIGS. 9A to 9D illustrate a first embodiment of a method for production of a lateral HEMT 3.

In this case, a substrate 10 is provided, for example having SiC or Si. A buffer layer 17 is applied on the substrate 10. In this case, the buffer layer 17 may, for example, have AlN, GaN or AlGaN. A first layer 11 is grown on the buffer layer 17. In the illustrated embodiment, the first layer 11 in this case has n-conductive GaN. A second layer 12 which, in the illustrated embodiment, has AlGaN is grown on the first layer 11. The AlGaN is in this case compensated, that is to say does not have any free charge carriers and is therefore electrically non-conductive. A passivation layer 18 is then applied on the second layer 12. In a further processes, a mask 24 is applied on the passivation layer 18, and is structured. By way of example, the passivation layer 18 may have $Si_xN_y$, $SiO_2$ or $Al_2O_3$. FIG. 9A illustrates the lateral HEMT 3 after the method.

The first layer 11, the second layer 12 and the passivation layer 18 are partially removed in a further process, for example by using an etching method. A third layer 13 which, in the illustrated embodiment, has p-conductive GaN is grown epitaxially on the first layer 11. This can be done by using selective expitaxy. In one embodiment, the third layer 13 may be applied non-selectively, and may then be structured by a CMP step (chemical mechanical polishing). FIG. 9B illustrates the lateral HEMT 3 after the processes.

Figure 9C:
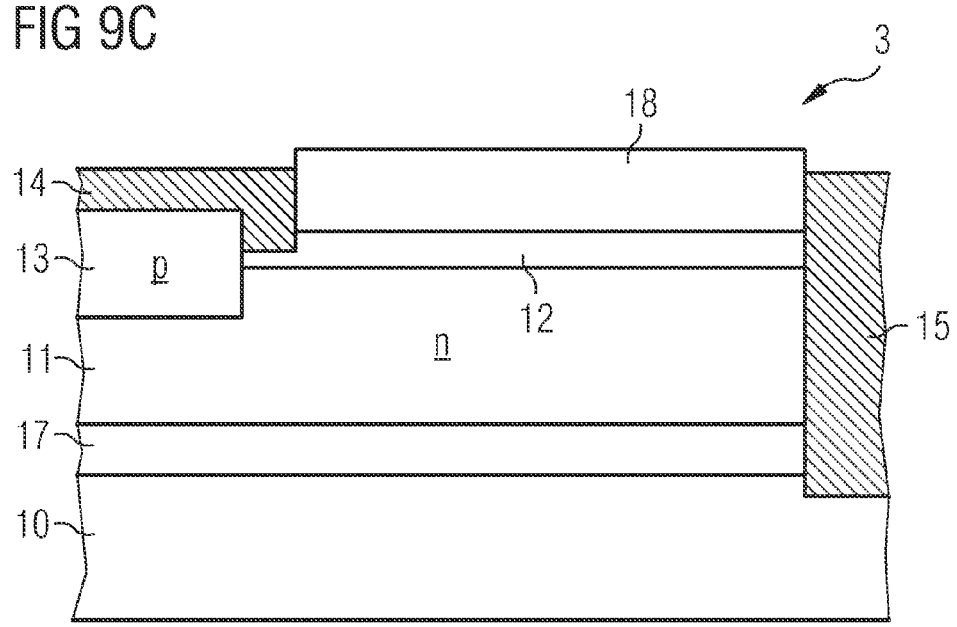

In a further process, the structured mask 24 is removed, for example by using a wet-chemical process. This is followed by partial opening of the passivation layer 18 and of the second layer 12, of the first layer 11, of the buffer layer 17 and of the substrate 10. An electrically conductive material, for example a metal, a silicide or heavily doped polysilicon, is introduced into the opened areas, thus forming a first electrode 14 and a second electrode 15. This is illustrated in FIG. 9C.

Figure 9D:
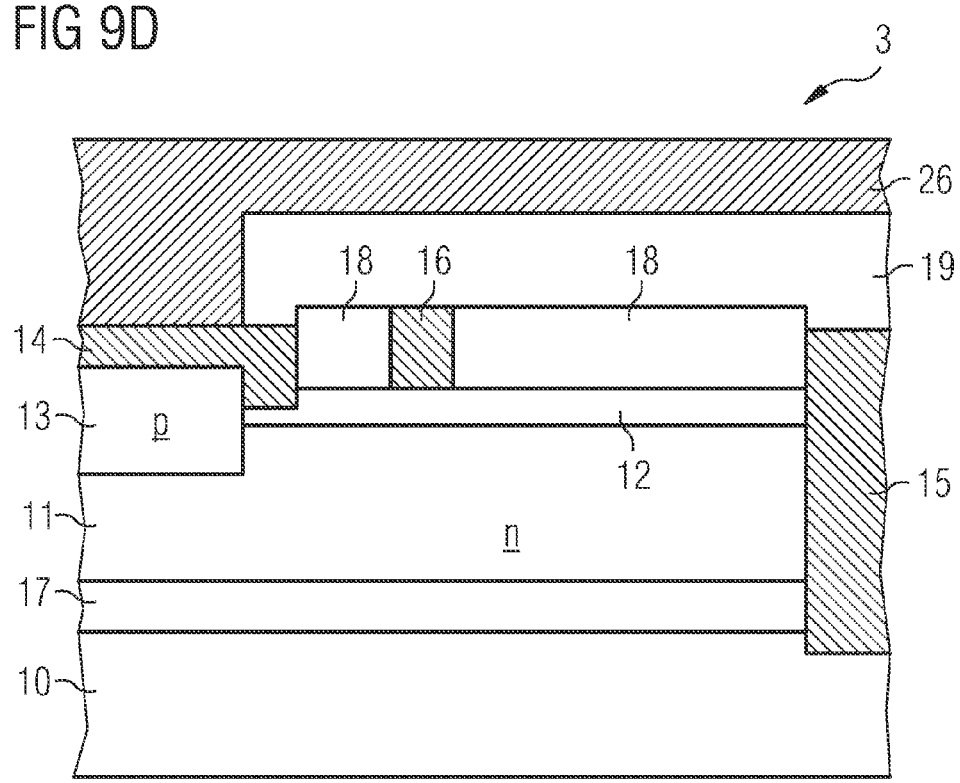

In a further process, the passivation layer 18 is partially removed, and a metal, for example gold, silver or platinum, is applied in the exposed area. This metal forms a gate electrode 16. Before the metal is applied, a thin layer, which has a dielectric, may be applied in the exposed area of the passivation layer 18. An insulation layer 19 is then applied on the passivation layer 18, to the gate electrode 16 and partially to the first electrode 14 and to the second electrode 15. In a further process, a layer 26 which has an electrically conductive material, for example a metal, is applied on the insulation layer 19 and partially to the first electrode 14. FIG. 9D illustrates the lateral HEMT 3 after the method.

FIGS. 10A to 10E illustrate a second embodiment of a method for production of a later HEMT 1.

Figure 10A:
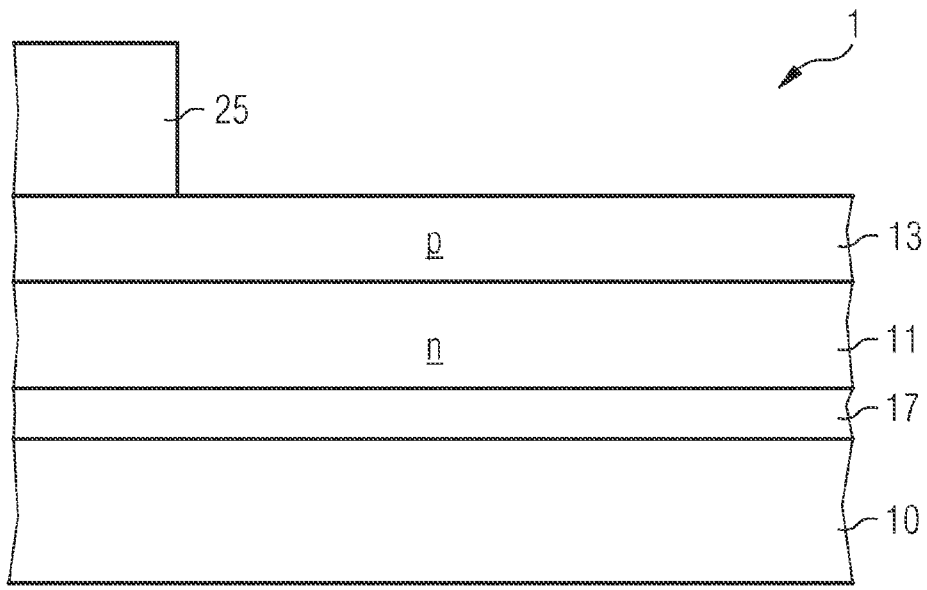
FIGS. 10A to 10E illustrate a second embodiment of a method for production of a lateral HEMT.

In this case, a substrate 10 is provided, for example having SiC or Si. A buffer layer 17 which, for example, has AlN, GaN or AlGaN is applied on the substrate 10. A first layer 11, which in the illustrated embodiment has n-conductive GaN, is grown on the buffer layer 17. A third layer 13, which in the illustrated embodiment has p-conductive GaN, is then grown on the first layer 11. A mask 25 is applied on the third layer 13, and is structured. FIG. 10A illustrates the lateral HEMT 1 after the method.

Figure 10B:
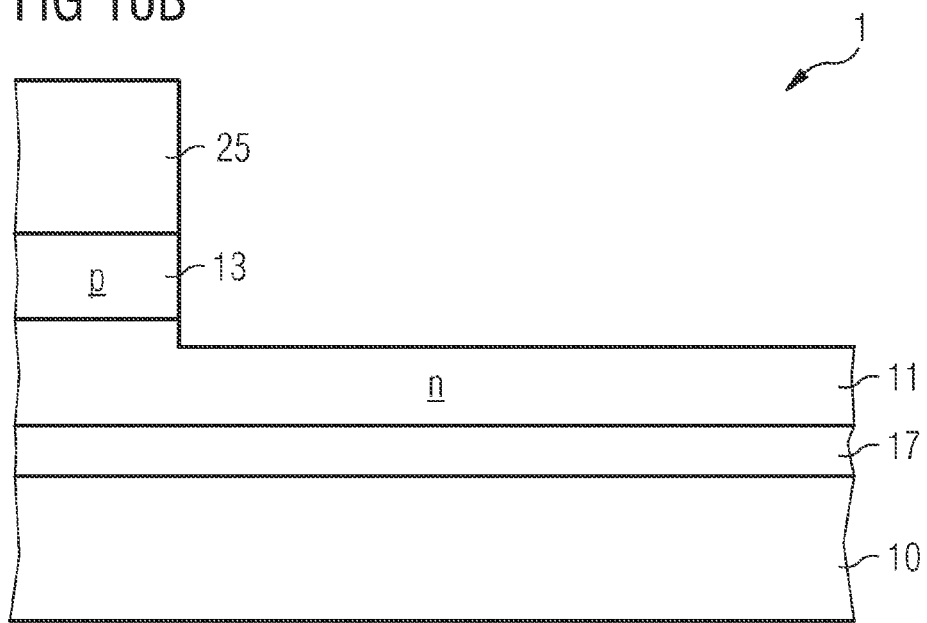

In a further process, the first layer 11 and the third layer 13 are partially removed, for example by using an etching process. This is illustrated in FIG. 10B.

Figure 10C:
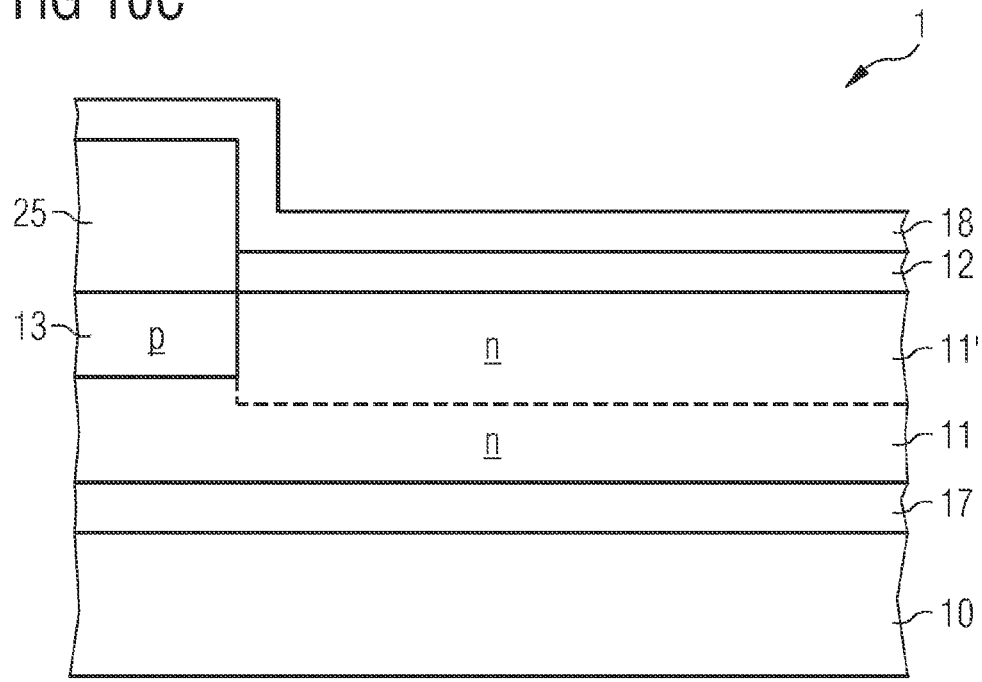

A layer 11', which likewise has n-conductive GaN, is grown on the exposed part of the first layer 11. A second layer 12, which in the illustrated embodiment has AlGaN, is then grown on the layer 11'. The AlGaN, is in this case compensated, that is to say it does not have any free charge carriers and is therefore electrically non-conductive. A passivation layer 18 is applied on the second layer 12 and to the mask 25. The passivation layer 18 can in this case, for example, have $Si_xN_y$. FIG. 10C illustrates the lateral HEMT 1 after the method.

Figure 10D:
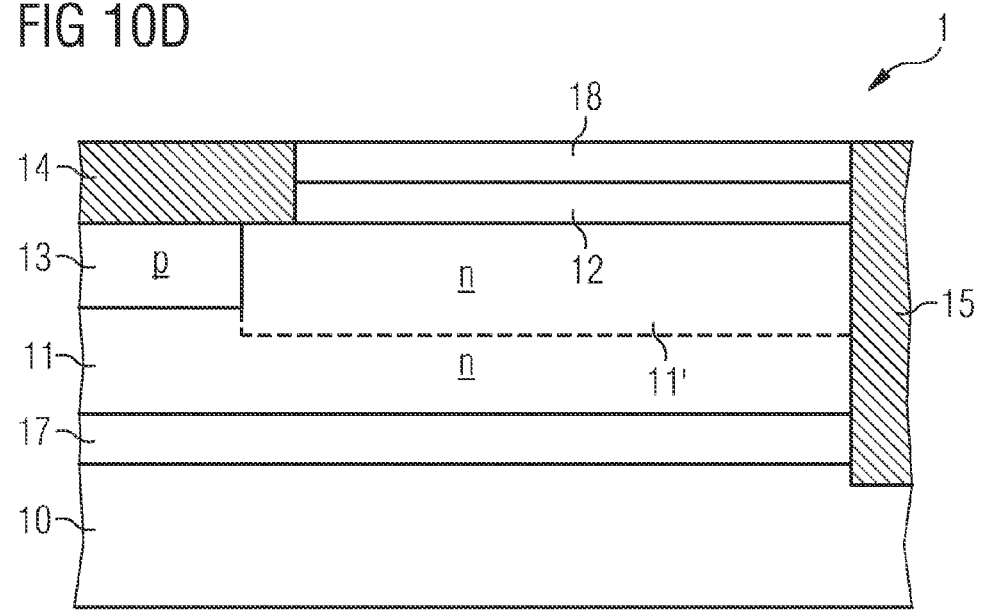

In a further process, the third layer 13, the second layer 12, the first layer 11 as well as the buffer layer 17 and the substrate 10 are partially exposed. The mask 25 is removed during this process. An electrically conductive material, for example a metal, a silicide or heavily doped polysilicon, is applied on the exposed areas, thus forming a first electrode 14 and a second electrode 15. FIG. 10D illustrates the lateral HEMT 1 after the method.

Figure 10E:
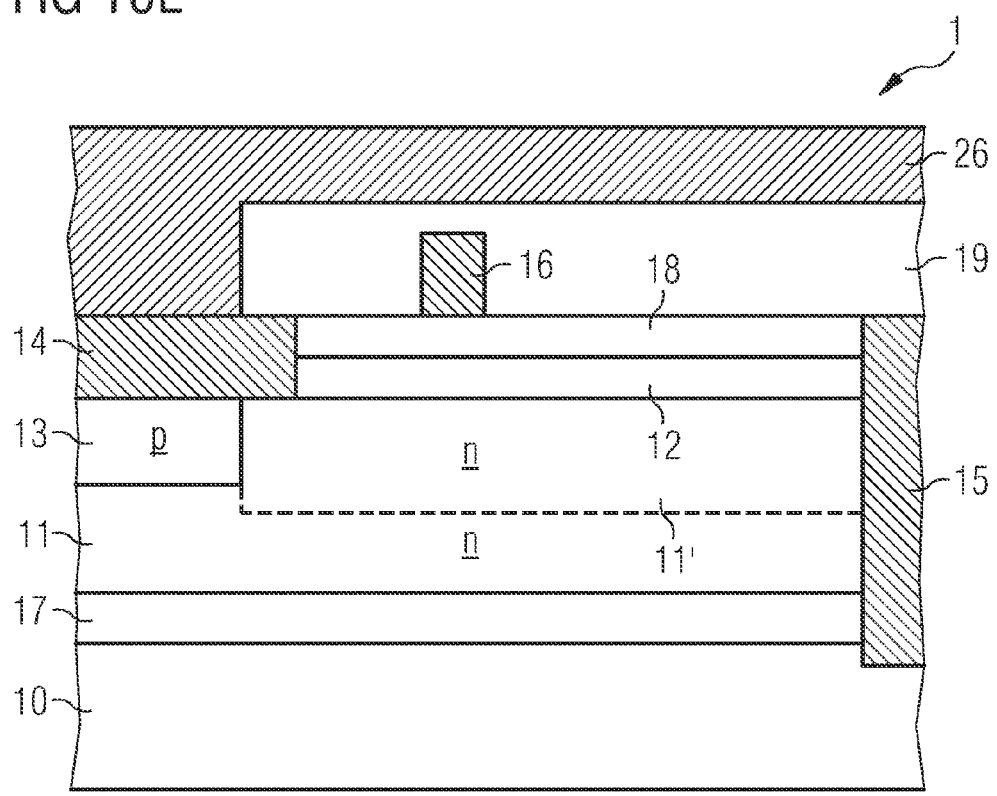

A gate electrode 16 and an insulation layer 19, which partially surrounds the gate electrode 16, are applied on the passivation layer 18. The insulation layer 19 is in this case likewise partially applied on the first electrode 14 and to the second electrode 15. A layer 26 which, for example, has a metal is then applied on the insulation layer 19 and to the exposed areas of the first electrode 14. FIG. 10E illustrates the lateral HEMT 1 after the method.

FIGS. 11A to 11E illustrate a third embodiment of a method for production of a lateral HEMT 2.

In this case, a substrate 10 is provided and, for example, has SiC or Si. A buffer layer 17 is applied on the substrate 17. In this case, the buffer layer 17 may have AlN, GaN or AlGaN. A first layer 11, which in the illustrated embodiment has n-conductive GaN, is grown on the buffer layer 17. A mask 23 is applied on the first layer 11, and is structured. In this case, by way of example, the mask 23 may have an oxide. FIG. 11A illustrates the lateral HEMT 2 after the method.

A third layer 13 is grown on the exposed areas of the first layer 11. The third layer in the illustrated embodiment has p-conductive GaN. This is illustrated in FIG. 11B.

In a further process, the third layer 13 is planarized, for example by using a CMP process (chemical mechanical polishing). This process can also be omitted if the third layer 13 has already previously been grown in a planar form. The mask 23 is then removed. FIG. 11C illustrates the lateral HEMT 2 after the method.

Figure 11D:
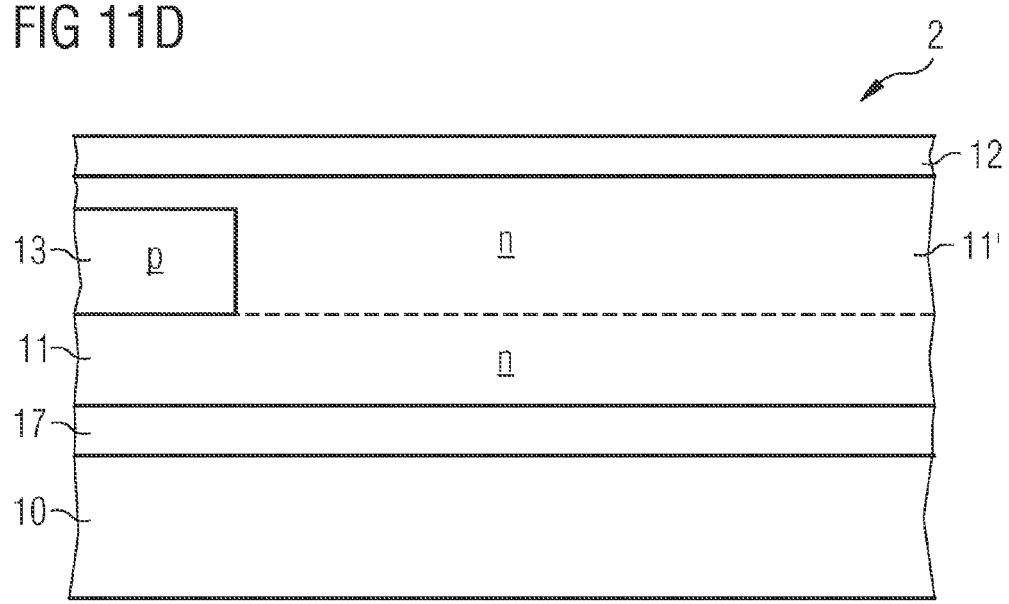

A layer 11' is grown on the exposed areas of the first layer 11 and on the third layer 13, wherein the layer 11' is in this case grown over the third layer 13. The layer 11' likewise has n-conductive GaN. In a further method step, the layer 11' may be planarized if required, wherein, for example, this can be done by using a CMP process. A second layer 12, which in the illustrated embodiment has AlGaN, is grown on the layer 11'. The AlGaN is in this case compensated, that is to say it does not have any free charge carriers and is therefore electrically non-conductive. FIG. 11D illustrates the lateral HEMT 2 after the method.

Figure 11E:
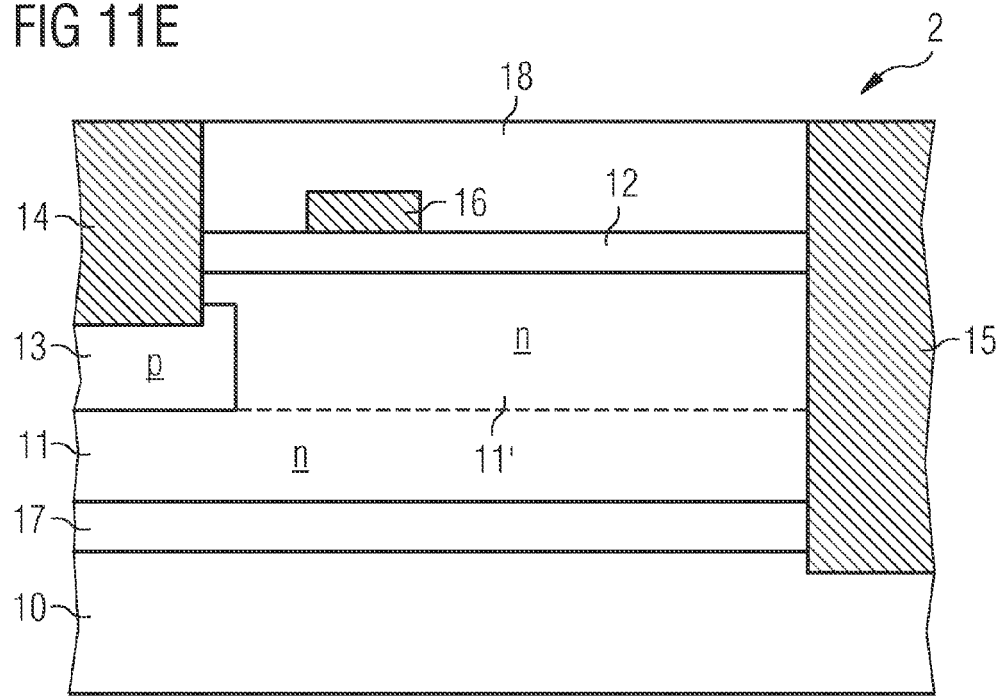

The second layer 12, the layer 11', the layer 11, the third layer 13 as well as the buffer layer 17 and the substrate 10 are partially exposed in a further process, and an electrically conductive material, for example a metal, a silicide or heavily doped polysilicon is introduced into the exposed areas. A first electrode 14 and a second electrode 15 are thus formed. A gate electrode 16 is applied on the second layer 12. A passivation layer 18 is then applied on the second layer 12 and to the gate electrode 16. FIG. 11E illustrates the lateral HEMT 2 after the method.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

The invention claimed is:

1. A power semiconductor including a lateral HEMT, comprising:
   a lateral HEMT comprising:
   a substrate
   a first layer, wherein the first layer has a semiconductor material of a first conduction type and is arranged at least partially on the substrate;
   a second layer, wherein the second layer has a semiconductor material and is arranged at least partially on the first layer; and
   a third layer, wherein the third layer has a semiconductor material of a second conduction type, which is complementary to the first conduction type, and is arranged at least partially in the first layer.

2. The semiconductor as claimed in claim 1, wherein the third layer is arranged completely in the first layer.

3. The semiconductor as claimed in claim 1, wherein the third layer is arranged partially in the second layer.

4. The semiconductor as claimed in claim 1, wherein the lateral HEMT has a first electrode, a second electrode and a gate electrode.

5. The power semiconductor including a lateral HEMT of claim 4, wherein the first layer and third layer together form a pn-diode which increases an avalanche breakdown strength of the HEMT.

6. The power semiconductor including a lateral HEMT of claim 5, wherein the pn-diode has a breakdown voltage lower than a breakdown voltage of the HEMT.

7. The power semiconductor including a lateral HEMT of claim 5, wherein the first electrode is arranged on the third layer, and wherein the second electrode is coupled to the first layer to provide the pn-diode.

8. The power semiconductor including a lateral HEMT of claim 5, wherein the first electrode is a source electrode and the second electrode is a drain electrode.

9. The semiconductor as claimed in claim 4, wherein the first electrode extends vertically from the second layer to the third layer, and the second electrode extends vertically from the second layer partially into the substrate.

10. The semiconductor as claimed in claim 1, wherein the lateral HEMT has a buffer layer, wherein the buffer layer is arranged between the substrate and the first layer.

11. The semiconductor as claimed in claim 1, wherein the lateral HEMT has a passivation layer, wherein the passivation layer is arranged at least partially on the second layer.

12. The semiconductor as claimed in claim 11, wherein the lateral HEMT has an insulation layer, wherein the insulation layer is arranged at least partially on the passivation layer.

13. A lateral HEMT, comprising:
   a substrate
   a first layer, wherein the first layer has a semiconductor material of a first conduction type and is arranged at least partially on the substrate;
   a second layer, wherein the second layer has a semiconductor material and is arranged at least partially on the first layer;
   a third layer, wherein the third layer has a semiconductor material and is arranged at least partially in the substrate;
   wherein the lateral HEMT has a first electrode, a second electrode and a gate electrode;

wherein the first electrode extends vertically from the second layer to the third layer, and the second electrode extends vertically from the second layer partially into the substrate; and wherein the semiconductor material of the third layer has a second conduction type, which is complementary to the first conduction type, and the substrate has a semiconductor material of the first conduction type.

\* \* \* \* \*